(12) United States Patent
Xhakoni et al.

(10) Patent No.: US 10,348,323 B2
(45) Date of Patent: Jul. 9, 2019

(54) ANALOG-TO-DIGITAL CONVERSION AND METHOD OF ANALOG-TO-DIGITAL CONVERSION

(71) Applicant: ams Sensors Belgium BVBA, Antwerp (BE)

(72) Inventors: Adi Xhakoni, Leuven (BE); Tim Blanchaert, Geel (BE); Guy Meynants, Retie (BE)

(73) Assignee: ams Sensors Belgium BVBA, Antwerp (BE)

( * ) Notice: Subject to any disclaimer, the term of this patent is extended or adjusted under 35 U.S.C. 154(b) by 0 days.

(21) Appl. No.: 15/773,537

(22) PCT Filed: Oct. 27, 2016

(86) PCT No.: PCT/EP2016/075962
§ 371 (c)(1),
(2) Date: May 3, 2018

(87) PCT Pub. No.: WO2017/076747
PCT Pub. Date: May 11, 2017

(65) Prior Publication Data
US 2018/0351570 A1 Dec. 6, 2018

(30) Foreign Application Priority Data
Nov. 6, 2015 (EP) .................... 15193534

(51) Int. Cl.
*H03M 1/12* (2006.01)
*H03M 1/18* (2006.01)
(Continued)

(52) U.S. Cl.
CPC ........... *H03M 1/56* (2013.01); *H03M 1/1245* (2013.01); *H03M 1/183* (2013.01); *H04N 5/355* (2013.01);
(Continued)

(58) Field of Classification Search
CPC ...... H03M 1/182; H03M 1/1235; H03M 1/56; H04N 5/365; H04N 5/3575; H04N 5/378; H04N 5/357; H04N 5/3742
(Continued)

(56) References Cited

U.S. PATENT DOCUMENTS 5,321,404 A 6/1994 Mallinson et al.
7,825,975 B2 11/2010 Fowler
(Continued)

FOREIGN PATENT DOCUMENTS

EP 2645575 A2 10/2013
EP 2750369 A2 7/2014
EP 2757776 A2 7/2014

OTHER PUBLICATIONS

Xhakoni, A. et al.: "PTC-Based Sigma-Delta ADCs for High-Speed, Low-Noise Imagers" 2014, Sensors Journal, IEEE 2932-2933.
(Continued)

*Primary Examiner* — Khai M Nguyen
(74) *Attorney, Agent, or Firm* — Fish & Richardson P.C.

(57) ABSTRACT

An analog-to-digital converter (110) comprises an analog signal input (122) for receiving an analog signal and an amplifying stage (160) configured to generate a set of N amplified analog signals, where N is an integer ≥2. The set of N signals have different gains. The ADC has a ramp signal input (121) for receiving a ramp signal and a clock input (143) for receiving at least one clock signal. A comparison stage (120) is connected to the set of amplified analog signals (SigG1, SigG2) and to the ramp signal input (121). The comparison stage (120) is configured to compare the amplified analog signals with the ramp signal to provide comparison outputs during a conversion period. A control stage is configured to control the counter stage (140) based on the comparison outputs and a selection input indicative of
(Continued)

when at least one handover point has been reached during the conversion period.

14 Claims, 11 Drawing Sheets

(51) Int. Cl.
    *H03M 1/56*     (2006.01)
    *H04N 5/355*     (2011.01)
    *H04N 5/357*     (2011.01)
    *H04N 5/365*     (2011.01)
    *H04N 5/378*     (2011.01)

(52) U.S. Cl.
    CPC ........... *H04N 5/3575* (2013.01); *H04N 5/365* (2013.01); *H04N 5/378* (2013.01); *H03M 1/1235* (2013.01)

(58) Field of Classification Search
    USPC ...... 341/155, 164, 167–170; 348/222.1, 302, 348/303, 308; 250/208.1
    See application file for complete search history.

(56) References Cited

U.S. PATENT DOCUMENTS

| | | | |
|---|---|---|---|
| 8,040,269 B2 | 10/2011 | Bogaerts | |
| 8,350,941 B2* | 1/2013 | Kukita | H04N 5/23241 |
| | | | 250/208.1 |
| 8,922,668 B2* | 12/2014 | Ota | H04N 5/357 |
| | | | 348/222.1 |
| 9,019,141 B2* | 4/2015 | Hashimoto | H04N 5/357 |
| | | | 341/168 |
| 9,686,492 B2* | 6/2017 | Uchida | H04N 5/37452 |
| 2013/0206961 A1 | 8/2013 | Ikeda et al. | |
| 2014/0209784 A1* | 7/2014 | Morita | H04N 5/378 |
| | | | 250/208.1 |

OTHER PUBLICATIONS

Snoeij, M. et al.: "Multiple-Ramp Column-Parallel ADC Architectures for CMOS Image Sensors" 2007, IEEE Journal of Solid-State Circuits 2968-2977.

* cited by examiner

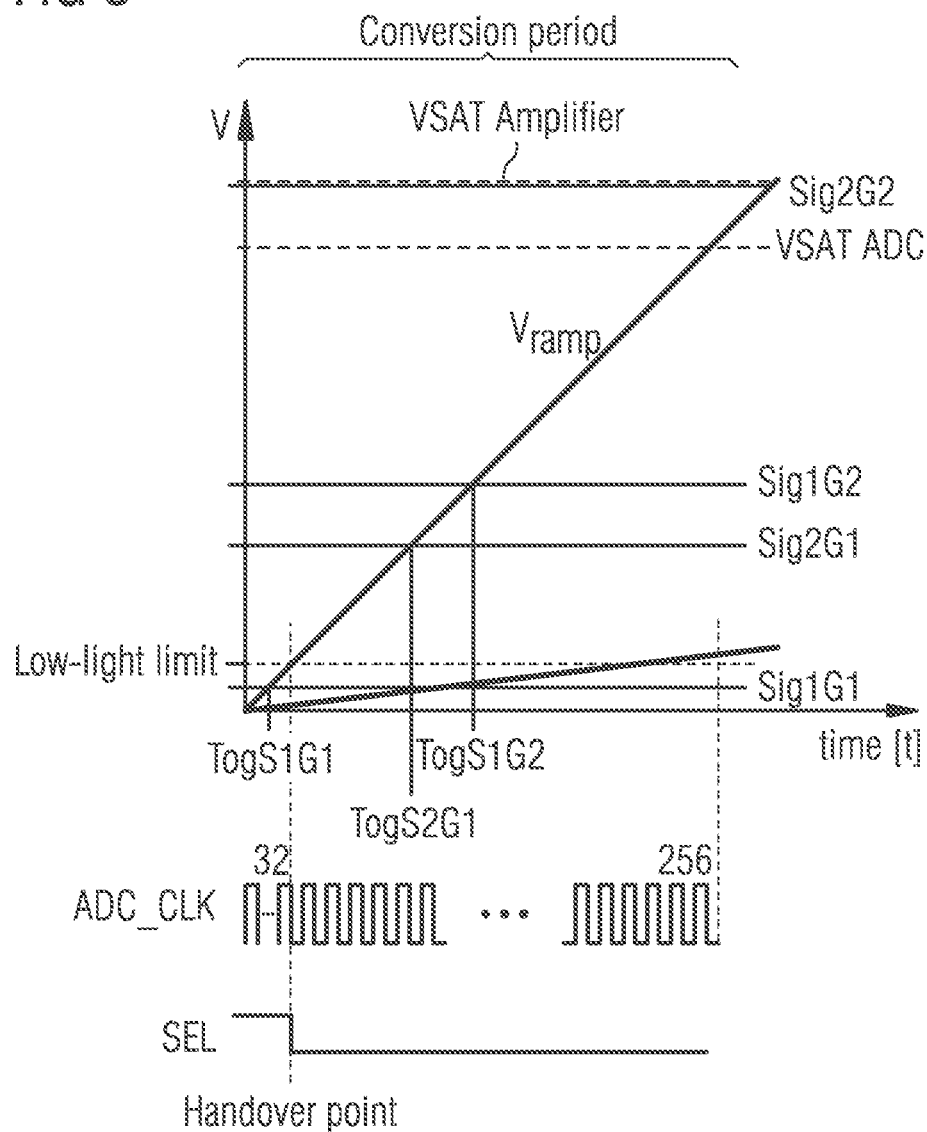

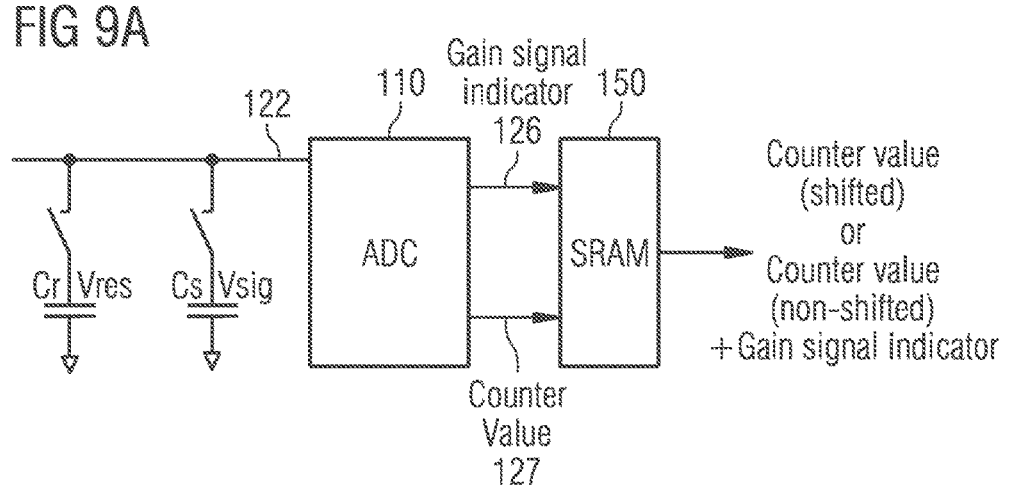
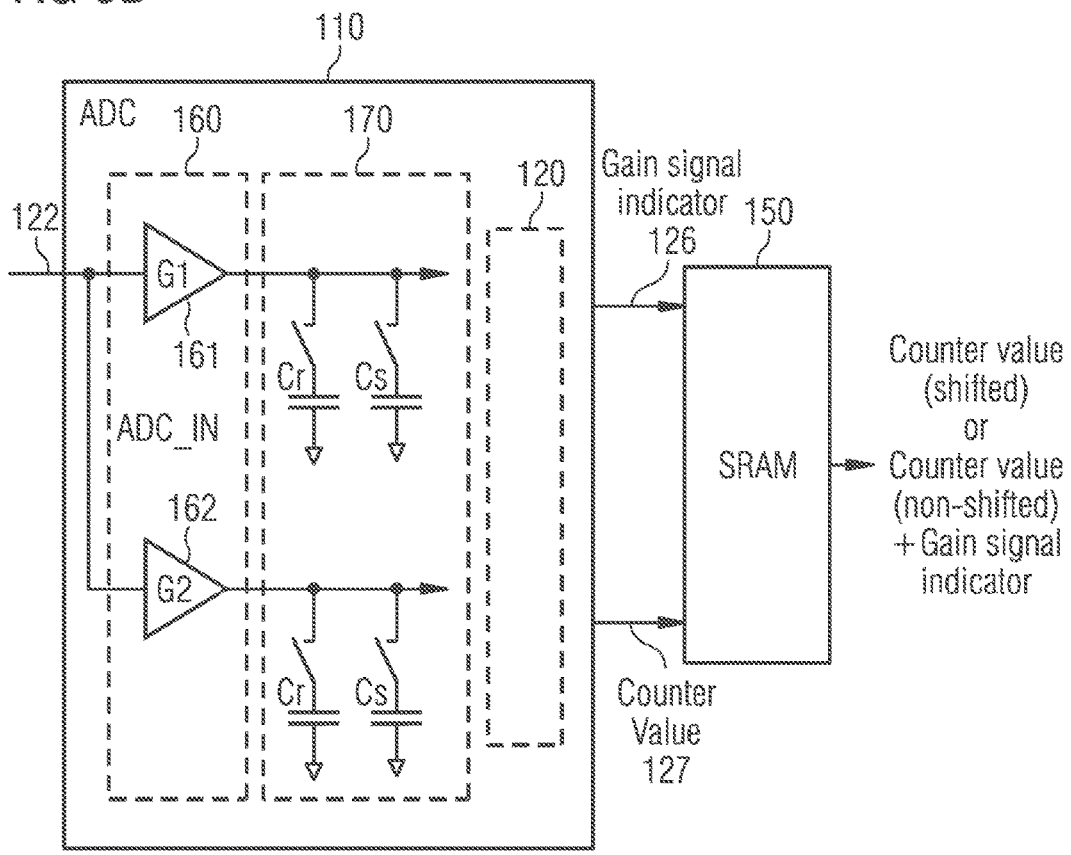

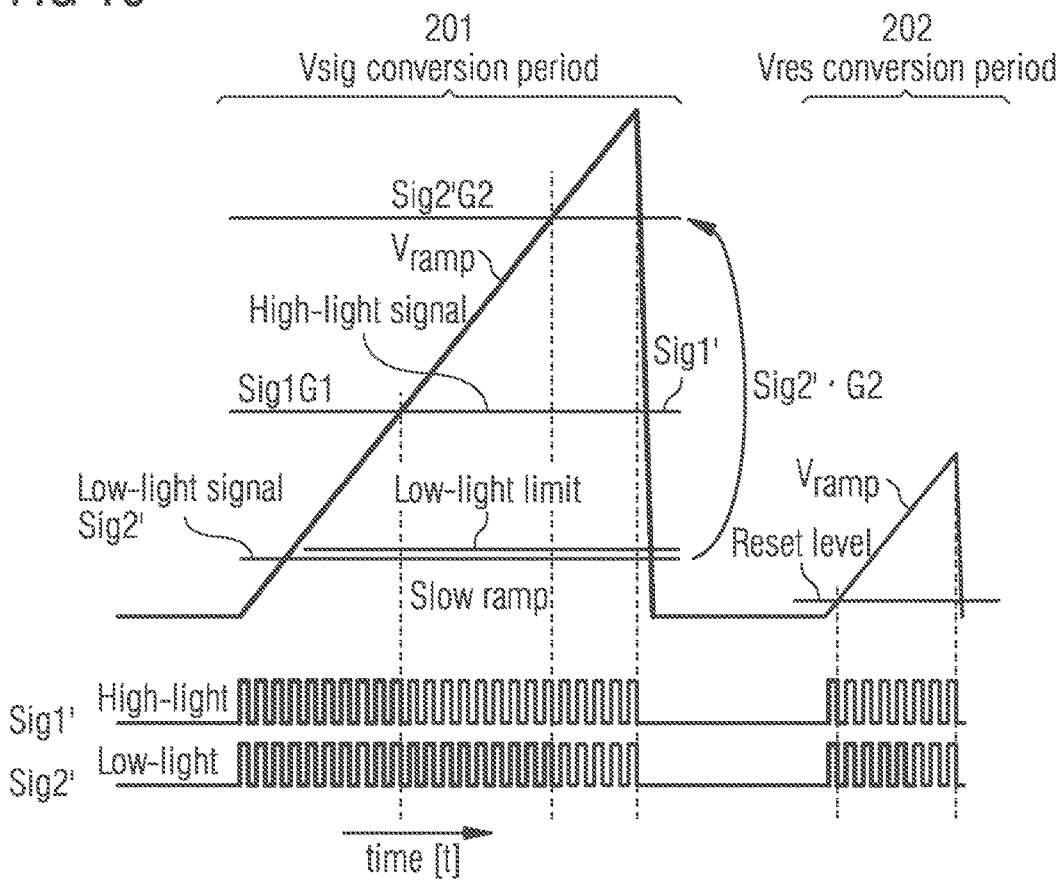

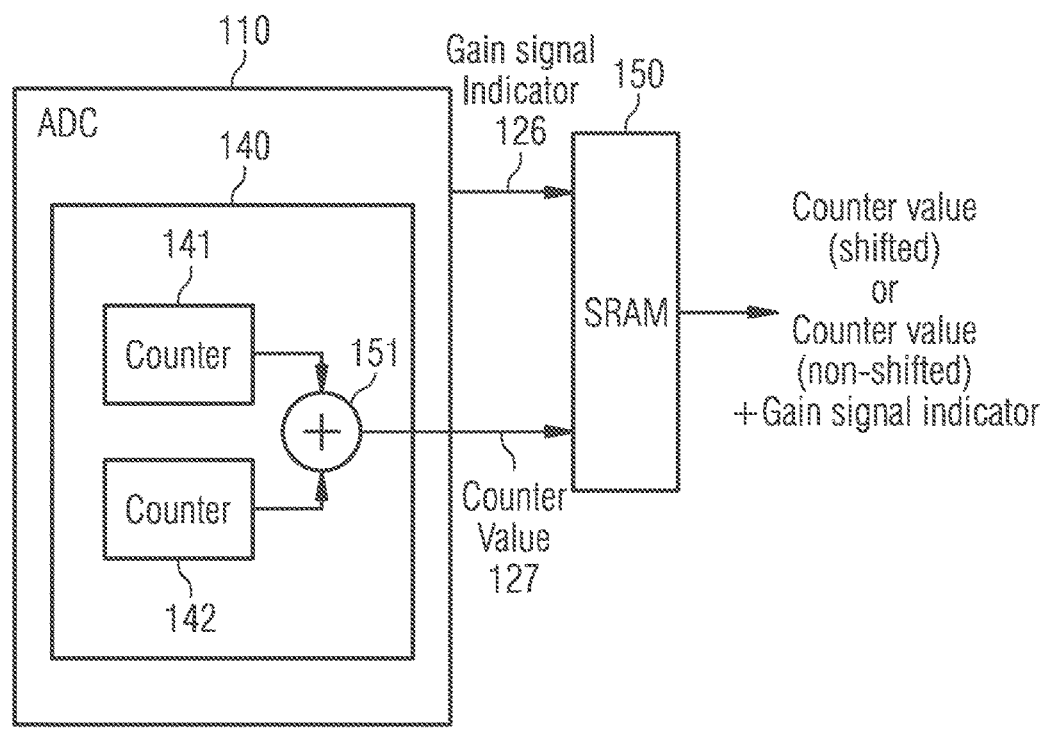

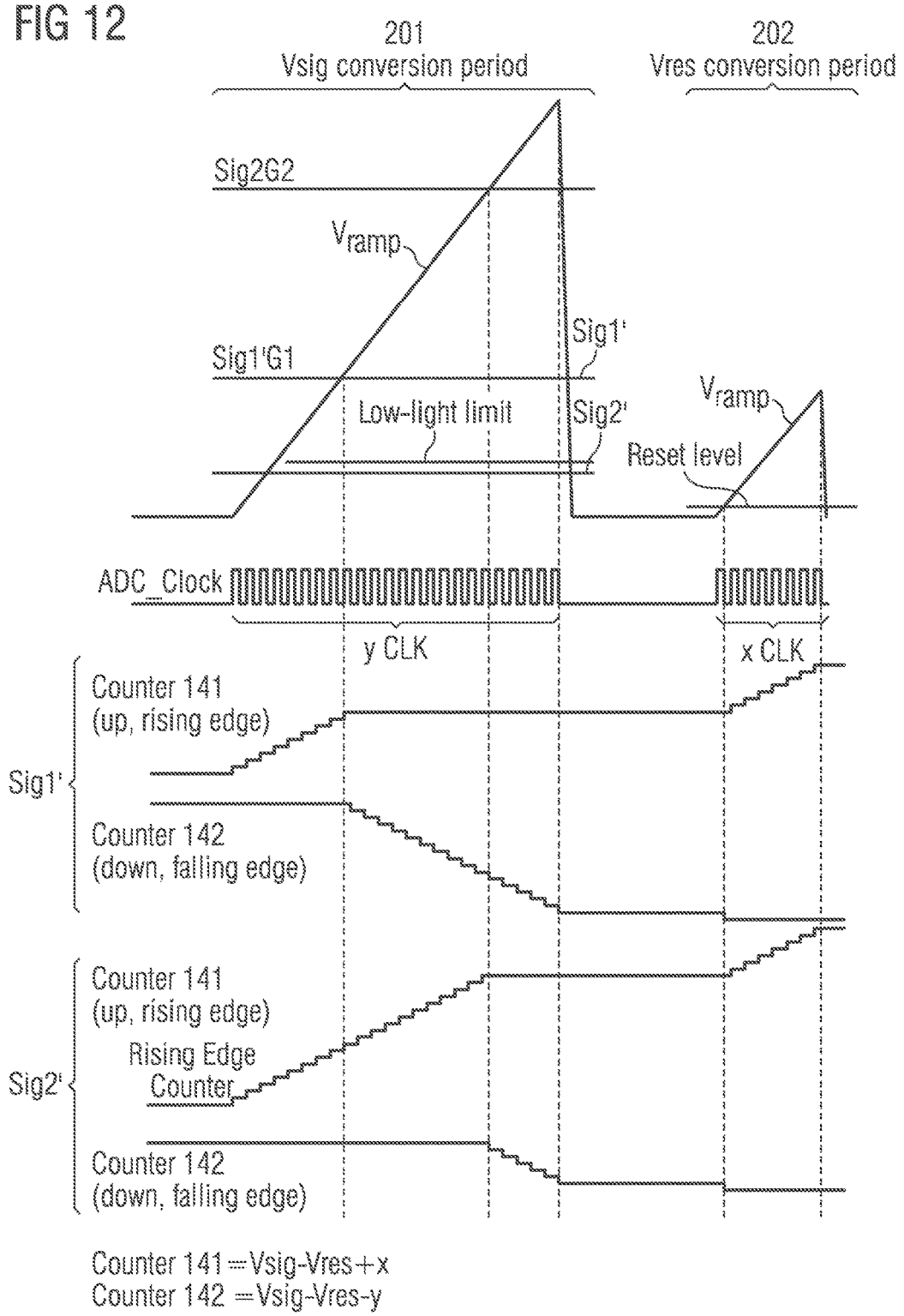

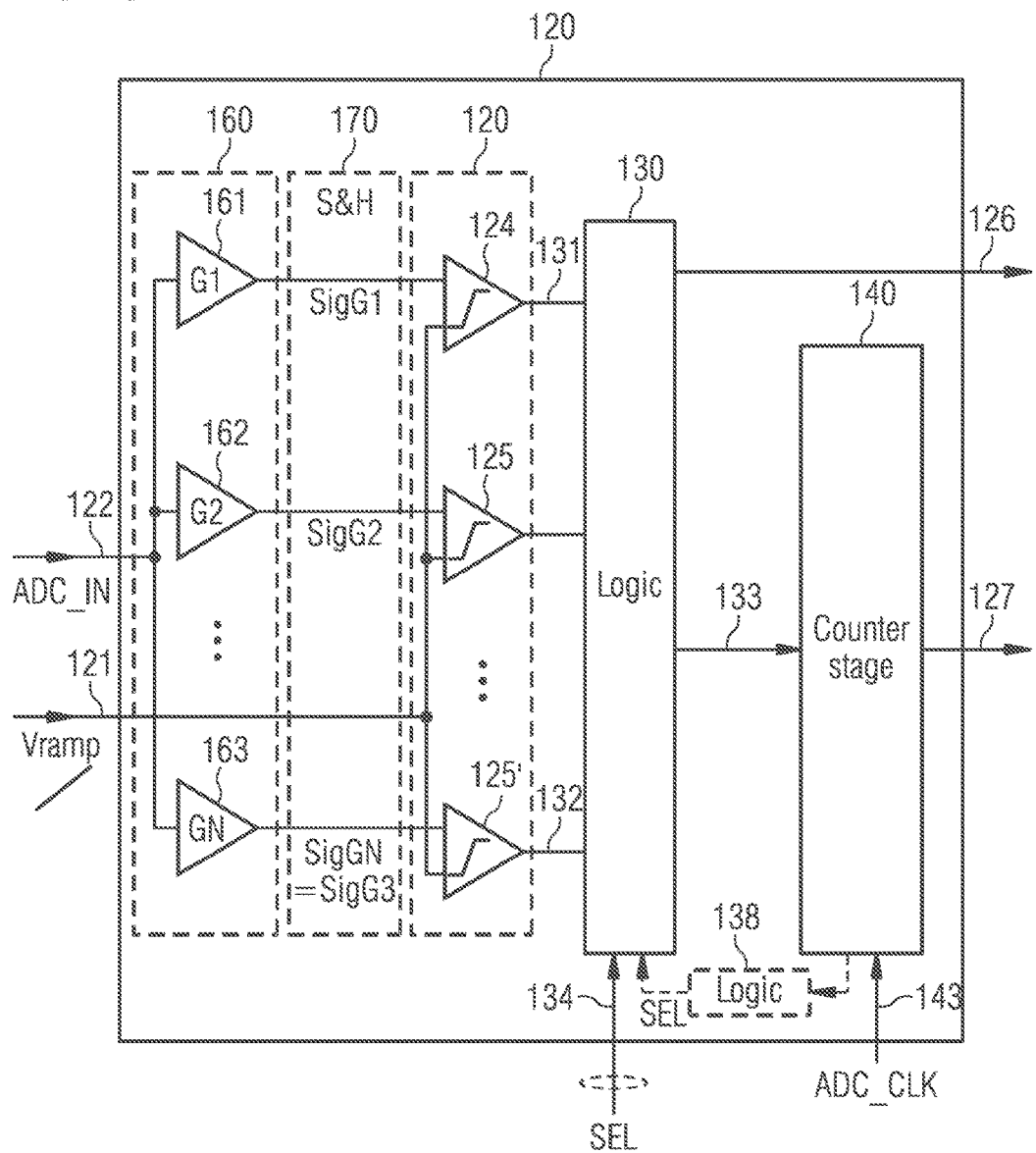

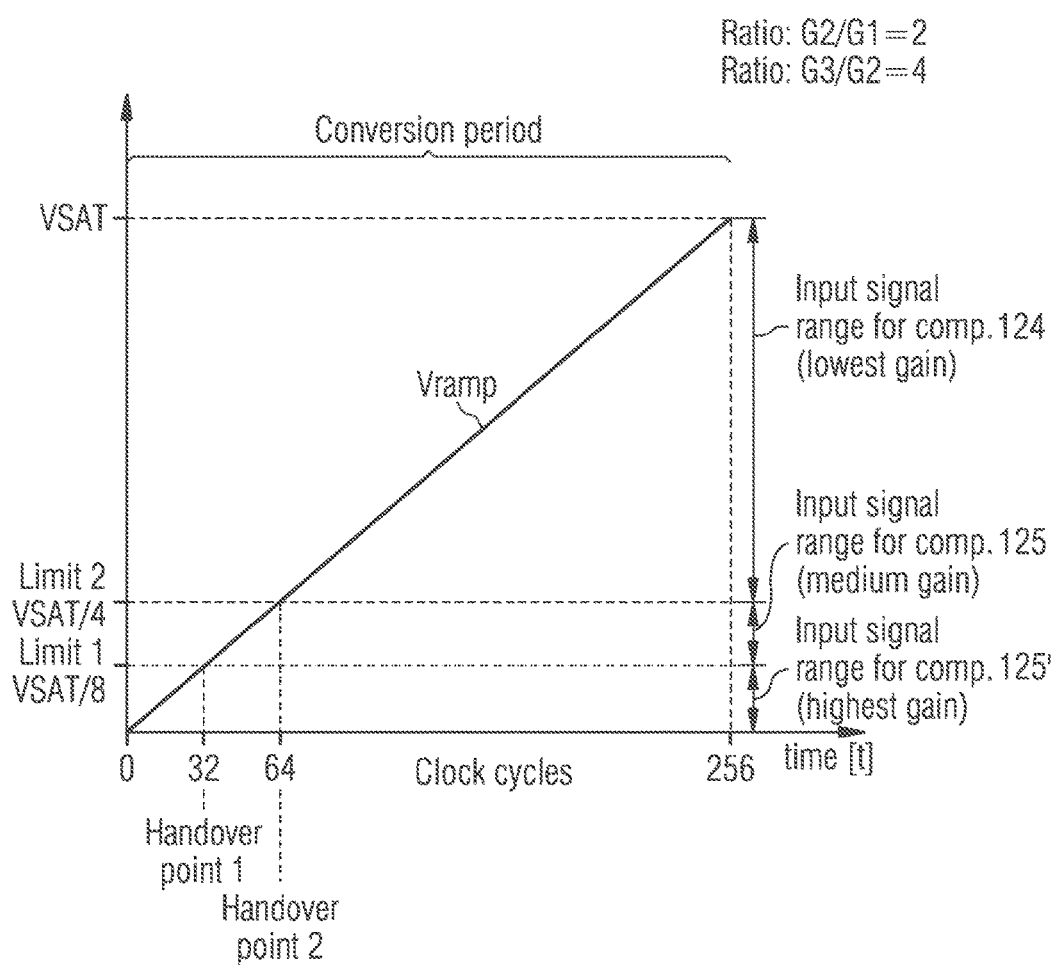

ANALOG-TO-DIGITAL CONVERSION AND METHOD OF ANALOG-TO-DIGITAL CONVERSION

CROSS-REFERENCE TO RELATED APPLICATIONS

The present application is the national stage entry of International Patent Application No. PCT/EP2016/075962, filed on Oct. 27, 2016, which claims the benefit of priority under 35 U.S.C. § 119 of European Patent Office Application 15193534.3 filed on Nov. 6, 2015, and relates to International Patent Application No. PCT/EP2016/075964, filed on Oct. 27, 2016, all of which are hereby incorporated by reference in their entirety for all purposes.

TECHNICAL FIELD

This invention relates to an analog-to-digital conversion apparatus and a method of performing analog-to-digital conversion which can be used, for example, to convert analog signal levels output from a pixel array of an image sensor.

BACKGROUND OF THE INVENTION

Image sensors comprise an array of unit elements, called pixels. The array of pixels is exposed to radiation during an exposure period and, subsequently, the signal value of each pixel is read from the array.

Pixel signals are analog signals. An analog-to-digital converter (ADC) is provided to convert the analog pixel signal into a digital signal. The ADCs are a major building block in image sensors and are often the bottleneck in the readout block of the imagers in terms of frame rate, dynamic range and power consumption. Various arrangements have been proposed where analog-to-digital conversion is performed, in parallel, for analog signal values read from columns of the array. This helps to increase the speed at which the pixel array can be read. FIG. 1 shows an example of an image sensor architecture with ADCs 20 provided for each column of a pixel array.

One known type of ADC in image sensors is a ramp ADC. This is shown in FIG. 1. A ramp generator 21 generates a ramp signal, Vramp, which is distributed to the ADCs 20. Each ramp ADC 20 has a comparator 23 which compares an analog pixel signal ADC_IN[0], ... ADC_IN[N] received from the pixel array 10 with the ramp signal, Vramp. Each analog-to-digital converter 20 also comprises a counter 24 which is enabled for a period of time based on the comparator output. This time period can be translated to a digital number by the digital counter 24 which is active during this period. Given its mostly digital nature, the ramp ADC scales well with the technology.

FIG. 2 shows the effect of ramp steepness and clock speed on the performance of the ramp converter. The counter value DN corresponds to the digital representation of the input analog signal. One way of reducing the quantisation error, and hence the Least Significant Bit (LSB) value, is to increase the clock speed, as shown in FIG. 2(B). Another way of reducing the quantisation error, and hence the Least Significant Bit (LSB) value, is to reduce the steepness of the ramp, as shown in FIG. 2(C). A significant drawback of reducing the steepness of the ramp is that the input range of the ADC is reduced accordingly. Therefore, the ADC is unable to convert the same range of analog signal values as the ADC of FIG. 2(A).

As each clock cycle corresponds to a quantisation step (LSB), the number of clock cycles needed for N bit resolution is equal to $2^N$. For example, a 12-bit resolution requires 4096 clock cycles. Even when a high clock speed of 1 GHz is used, it takes over 4 µs time to complete the analog-to-digital conversion. It follows that this converter topology becomes slow and power-inefficient as the number of bits of resolution increases.

Therefore, new solutions are needed to increase the conversion speed of such converter at higher bit resolutions.

To reduce the conversion time and/or reduce the power consumption of the ADCs, a photon-transfer-curve (PTC) method has been proposed for image sensor ADCs. An example is described in the paper "PTC-Based Sigma-Delta ADCs for High-Speed, Low-Noise Imagers", Xhakoni, A., Ha Le-Thai, T. Geurts, G. Chapinal, and G. Gielen, 2014, Sensors Journal, IEEE 2932-2933. The principle is shown in FIG. 3. In FIG. 4, line A illustrates a signal, line B a photon shot noise and line C a quantization noise.

A PTC-based ADC uses a small quantisation step at low light and a large quantisation step at higher light levels. At high light levels the noise of the readout chain is dominated by the photon shot noise of the photodiode, which is signal dependent. Therefore, the larger quantisation step of the PTC ADC at high light levels has a minimal impact on the SNR.

FIG. 4 shows the impact of the PTC-based quantisation in the SNR of the pixel readout chain when a pixel with 10 ke-full well is used. The difference in SNR between the PTC-based 12 bit ADC and the conventional 12 bit ADC is a SNR dip of about 0.2 dB at mid-light level.

U.S. Pat. No. 7,825,975 B2 describes an image sensor with a signal digitising circuit connected to a pixel. The signal digitising circuit converts a voltage signal from a pixel into a plurality of output digital values and selects one of the digital values. Each signal digitising circuit comprises a plurality of amplifiers and a plurality of ADCs.

The present patent application seeks to provide an alternative analog-to-digital converter.

SUMMARY OF THE INVENTION

In an embodiment, an analog-to-digital converter for an imaging device comprises:

an analog signal input for receiving an analog signal from a pixel array of the imaging device;

an amplifying stage configured to generate a set of N amplified analog signals, where N is an integer ≥2, the set of N signals having different gains;

a ramp signal input for receiving a ramp signal;

a clock input for receiving at least one clock signal;

a comparison stage connected to the amplified analog signals and to the ramp signal input, the comparison stage configured to compare the amplified analog signals with the ramp signal during a conversion period to provide comparison outputs;

a counter stage; and a control stage which is configured to control the counter stage based on the comparison outputs and a selection input indicative of when at least one handover point has been reached during the conversion period, wherein the handover point is indicative of a point at which a comparison of a different one of the amplified analog signals with the ramp signal can be used to control the counter stage.

The comparison stage may comprise a minimum of two comparators.

The comparison stage of the analog-to-digital converter, abbreviated ADC, may simultaneously compare each of the N amplified analog signals with the ramp signal to provide N comparison outputs. Alternatively, the comparison stage of the ADC may simultaneously compare a number S of the N amplified analog signals (where S<N) with the ramp signal to simultaneously provide S comparison outputs. The comparison stage may be configured to selectively compare different ones of the amplified analog signals with the ramp signal during the conversion period.

The control stage can be configured to:

determine, during the conversion period, if a first comparison output of a first amplified analog signal has changed state before the at least one handover point; and if the first comparison output has not changed state before the at least one handover point, to use a comparison output of a lower gain amplified analog signal to control the counter stage.

The control stage may use a comparison output of the highest gain amplified analog signal to control the counter stage from a start of the conversion period up to a first handover point. The gain of the lower gain amplified analog signal is lower than the gain of the highest gain amplified signal. The comparison output of the next lower gain amplified analog signal may be used to control the counter stage, if the first comparison output has not changed state before the at least one handover point.

The control stage can be configured to:

control the counter stage using a comparison output of one of the amplified analog signals;

determine, during the conversion period, if a comparison output of a first amplified analog signal has changed state before the at least one handover point; and if the first comparison output has changed state before the at least one handover point, to continue to control the counter stage using the same comparison output.

The number n is a natural number and obtains values between 1 and N.

The first amplified analog signal (n=1) is the lowest gain amplified analog signal and has the lowest gain. The Nth amplified analog signal is the highest gain amplified analog signal and has the highest gain.

The (n+1)th amplified analog signal has a higher gain than the nth amplified analog signal. This is valid for each number n between $1 \leq n \leq N-1$.

The conversion period may have a predetermined duration.

The ADC can comprise an output stage which is configured to output a counter value which has been scaled based on a comparison output of which amplified analog signal controlled the counter stage during the conversion period.

An output stage of the ADC can be configured to output a counter value and an indication of a comparison output of which amplified analog signal controlled the counter stage during the conversion period.

The ADC can be configured to convert a first analog signal during a first conversion period and to convert a second analog signal during a second conversion period, wherein one of the analog signals represents a signal level following exposure of a pixel of the pixel array and the other of the analog signals represents a reset level of the pixel of the pixel array.

The pixel array may consist of one pixel or of 1 times K pixels or of L times K pixels.

The ADC can be configured to: select a comparison output of one of the amplified analog signals to control the counter stage during the first conversion period; and subsequently, use the same comparison output to control the counter stage during the second conversion period.

The ADC can be configured to: select a comparison output of one of the amplified analog signals to control the counter stage during the first conversion period; and select a comparison output of a different one of the amplified analog signals to control the counter stage during the second conversion period.

The ADC can be configured to: convert the first analog signal representing the signal level following exposure of the pixel during the first conversion period; and subsequently, convert the second analog signal representing the reset level of the pixel during the second conversion period.

Alternatively, the ADC can be configured to: convert the first analog signal representing the reset level of the pixel during the first conversion period; and subsequently, convert the second analog signal representing the signal level following exposure of the pixel during the second conversion period.

For example, the first conversion period may be before the second conversion period.

The ADC can be configured to determine when the handover point has been reached during the conversion period using an output of the counter stage.

The ADC can comprise an analog signal storage stage connected between the amplifying stage and the comparison stage, the analog signal storage stage configured to store a set of amplified analog signals. The analog signal storage stage may be realized as a sample and hold stage. The analog signal storage stage may be connected between the amplifying stage and the comparison stage.

The comparison stage can comprise N comparators, each comparator having a first comparator input connected to one of the N amplified signal outputs, a second input connected to the ramp signal input and a comparison output.

For the N>2 case it can be possible to use a minimum of two comparators. One of the comparators can be connected to the highest gain amplified signal. The other comparator can be selectively connected to one of the amplified signals.

Another aspect provides an analog-to-digital conversion apparatus comprising:

a plurality of analog-to-digital converters;

a ramp signal generator configured to generate a ramp signal; and a clock signal generator configured to generate at least one clock signal.

Another aspect provides an image sensor comprising a pixel array and the analog-to-digital conversion apparatus.

Another aspect provides a method of analog-to-digital conversion for an imaging device comprising:

receiving an analog signal from a pixel array of the imaging device;

receiving a ramp signal;

receiving at least one clock signal;

generating a set of N amplified analog signals, where N is an integer $\geq 2$, the set of N amplified analog signals having different gains;

comparing the amplified analog signals with the ramp signal during a conversion period; and controlling a counter stage based on the comparison outputs and a selection input indicative of when at least one handover point has been reached during the conversion period. The handover point is indicative of a point at which a comparison of a different one of the amplified analog signals with the ramp signal can be used to control the counter stage.

The control stage can be configured to change, during the conversion period, which one of the comparison outputs controls the counter stage.

An output stage of the ADC can be configured to output a digital value representative of a difference between the first analog signal and the second analog signal.

A comparator stage may compare the ramp signal with the amplified analog signals during the conversion period to provide comparison outputs.

The comparison stage may comprise at least two comparators. Advantageously, by the use of at least two comparators, only one step for storage of counter content and only one register may be required. The speed of conversion may be kept high. The power consumption of the ADC may be reduced, since a counter is the major power consuming block of a ramp ADC.

Each of the comparators receives the same ramp signal. The at least two comparators may be realized identical.

One of the at least two comparators may receive the lowest gain amplified analog signal, namely the first amplified analog signal. Said comparator may be called lowest gain comparator.

In an embodiment, the ADC comprises two comparators and uses two amplified analog signals. The highest gain amplified analog signal is provided to the highest gain comparator and the lowest gain amplified analog signal is provided to the lowest gain comparator. Since N=2, this situation can be described in the following way: A low gain amplified analog signal is provided to a low gain comparator and a high gain amplified analog signal is provided to a high gain comparator. The low gain amplified analog signal is the first amplified analog signal. The high gain amplified analog signal is the second amplified analog signal. Thus, each comparator is permanently connected to its own amplified analog signal. The number of comparators and the number of amplified analog signals is exactly two. Advantageously, switching to and, hence disturbances on the amplified analog signals are avoided. The ADC may be free of a switch between an amplifier and a comparator connected to the output of the amplifier. Advantageously, if the analog signal provided by a pixel has a low level, the highest gain amplified analog signal is used for controlling the counter stage. Providing a comparator for comparison of the highest gain amplified analog signal with the ramp signal increases accuracy.

In an embodiment, the ADC comprises N comparators and uses N amplified analog signals. Each comparator is permanently connected to its own amplified analog signal. Advantageously, a switching from one amplified analog signal to another is avoided. The number of comparators and the number of amplified analog signals is exactly N, with N≥2.

In an embodiment, the ADC comprises M comparators and uses N amplified analog signals, where N>M≥2.

In an embodiment, the ADC may comprises exactly two comparators and uses exactly N amplified analog signals with N>2 (thus, M=2). Thus, the number of the amplified analog signals is higher than the number of the comparators. One of the comparators is connected to the lowest gain amplified analog signal. The other comparator is selectively connected to one of the amplified analog signals to control the counter stage. Optionally, the other comparator is selectively connected to one of the amplified analog signals with the exception of the lowest gain amplified analog signal.

The control stage uses a comparison output of the highest gain amplified analog signal to control the counter stage from a start of the conversion period up to a first handover point.

The control stage determines, during the conversion period, if the lowest gain comparison output of the lowest gain amplified analog signal has changed state before the first handover point.

If the lowest gain comparison output has not changed state before the first handover point, the control stage uses a comparison output of a lower gain amplified analog signal to control the counter stage after the first handover point. The lower gain amplified analog signal has a lower gain—e.g. the next lower gain—than the highest gain amplified analog signal.

If the lowest gain comparison output has changed state before the first handover point, the control stage continues to control the counter stage using the same comparison output after the first handover point. Thus, the highest gain amplified analog signal is used to control the counter stage after the first handover point.

In case N=3, the control stage determines, if the lowest gain comparison output of the lowest gain amplified analog signal changes state after the first handover point and before a second handover point.

If the lowest gain comparison output has not changed state after the first handover point and before the second handover point, the control stage uses a comparison output of a further lower gain amplified analog signal to control the counter stage after the second handover point.

If the lowest gain comparison output has changed state after the first handover point and before the second handover point, the control stage controls the counter stage using the lower comparison output after the second handover point.

Thus, the lower gain amplified analog signal is the low gain amplified analog signal in the case of two amplified analog signals (N=2) and a medium gain amplified analog signal in the case of three amplified analog signals (N=3).

The counter stage can comprise a plurality of counters which are divided into a first counter sub-set and a second counter sub-set, and the control stage can be configured to enable the first counter sub-set or the second counter sub-set.

The first counter sub-set can be configured to count in an upwards direction and the second counter sub-set can be configured to count in a downwards direction.

The plurality of counters can be configured to use clock signals which are offset in phase.

The pixel array and/or the analog-to-digital conversion apparatus can be manufactured using a technology such as Complementary Metal Oxide Semiconductor (CMOS).

The pixel array can be a one dimensional array (linear sensor) or a two dimensional array (area array) of pixels or a single pixel.

In an embodiment, an analog-to-digital converter for an imaging device comprises an analog signal input for receiving an analog signal from a pixel array of the imaging device; an amplifying stage configured to generate a set of N amplified analog signals, where N is an integer ≥2, the set of N signals having different gains; a ramp signal input for receiving a ramp signal; a clock input for receiving at least one clock signal; a comparison stage connected to the amplified analog signals and to the ramp signal input, the comparison stage being configured to compare the amplified analog signals with the ramp signal during a conversion period to provide comparison outputs; a counter stage; and a control stage which is configured to control the counter stage based on the comparison outputs and a selection input indicative of when at least one handover point has been reached during the conversion period.

The handover point is indicative of a point at which a comparison of a different one of the amplified analog signals with the ramp signal can be used to control the counter stage.

The handover point is indicative of a point at which a comparison output of the present amplified analog signal with the ramp signal or a comparison output of a different one of the amplified analog signals with the ramp signal is selectively used to control the counter stage after said handover point.

The selection depends on the fulfilment of a condition. The selection depends on whether a comparison output of the lowest gain amplified analog signal has changed state before the handover point associated with a comparison output of an $n^{th}$ amplified analog signal has been reached, where n is an integer in the range 1 . . . N−1.

In an embodiment, during the complete conversion period, the ramp signal is compared with the lowest gain amplified analog signal to perform the selection of the amplified analog signal that controls the counter stage.

From the start of the conversion period up to the first handover point, the ramp signal is compared with the highest gain amplified analog signal to control the counter stage.

The set of N amplified analog signals comprises the highest gain amplified analog signal and the lowest gain amplified analog signal. The set of N amplified analog signals may also comprise the lower gain amplified analog signal. In case N=2, the lower gain amplified analog signal may be the lowest gain amplified analog signal.

Advantageous features may be combined as appropriate, as would be apparent to a skilled person, and may be combined with any of the aspects of the invention.

BRIEF DESCRIPTION OF THE DRAWINGS

Embodiments of aspects of the invention will be described, by way of example, with reference to the following drawings, in which:

FIG. 8 shows operation of the ADC of FIGS. 6 and 7;
FIGS. 9A and 9B show an ADC unit for converting two analog signals;
FIG. 10 shows operation of the ADC of FIGS. 9A and 9B during two conversion periods;
FIG. 11 shows an ADC unit with multiple counters;
FIG. 12 shows operation of the ADC of FIG. 11;
FIG. 13 shows an ADC unit with N gain stages;
FIG. 14 shows operation of the ADC of FIG. 13.

DETAILED DESCRIPTION

Embodiments of the present patent application are described below by way of example only. The description sets forth the functions of the example and the sequence of steps for constructing and operating the example. However, the same or equivalent functions and sequences may be accomplished by different examples.

Throughout this specification, it should be noted that the term "row" and "column" can be interchanged. Also, the term "row" does not imply a particular orientation of the array.

Figure 1:
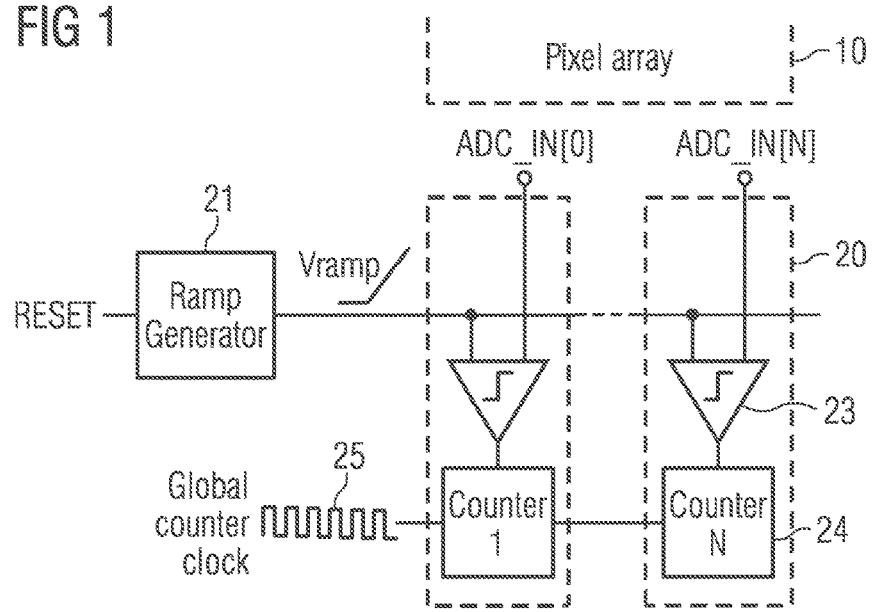
FIG. 1 shows column units of a ramp ADC.
Figure 2:
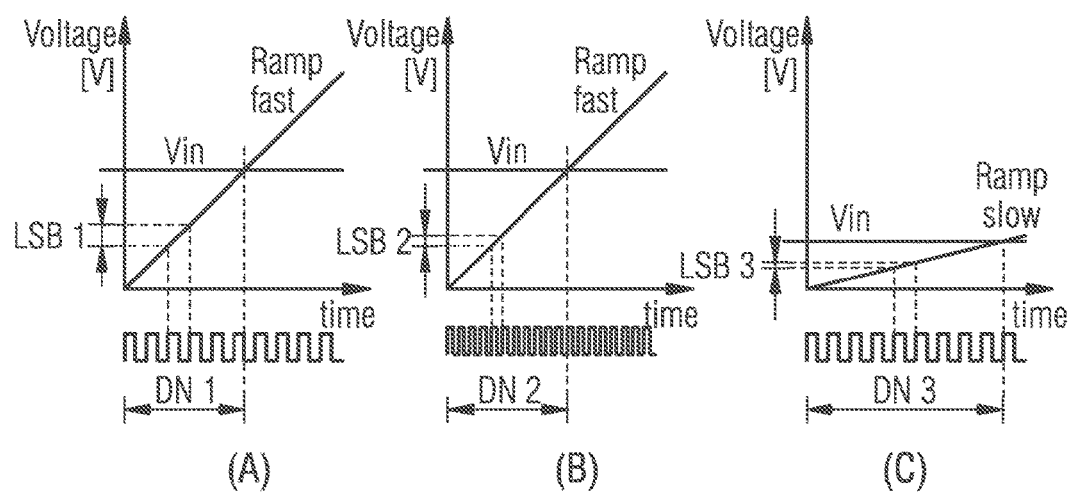
FIG. 2 shows some possible ways of reducing quantisation error.
Figure 3:
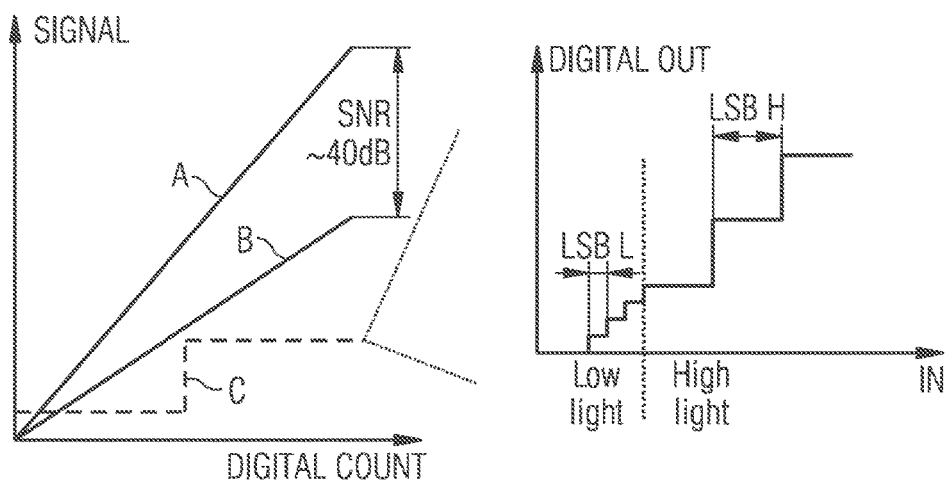
FIG. 3 shows a photon-transfer-curve (PTC) method for image sensor ADCs.
Figure 4:
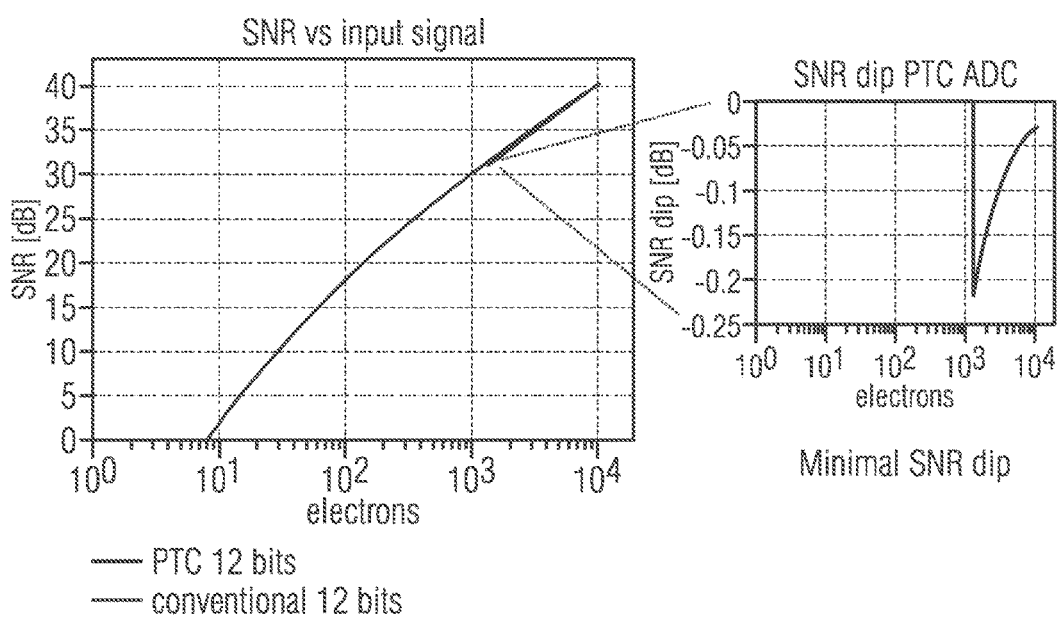
FIG. 4 shows performance of the PTC method of FIG. 3.
Figure 5:
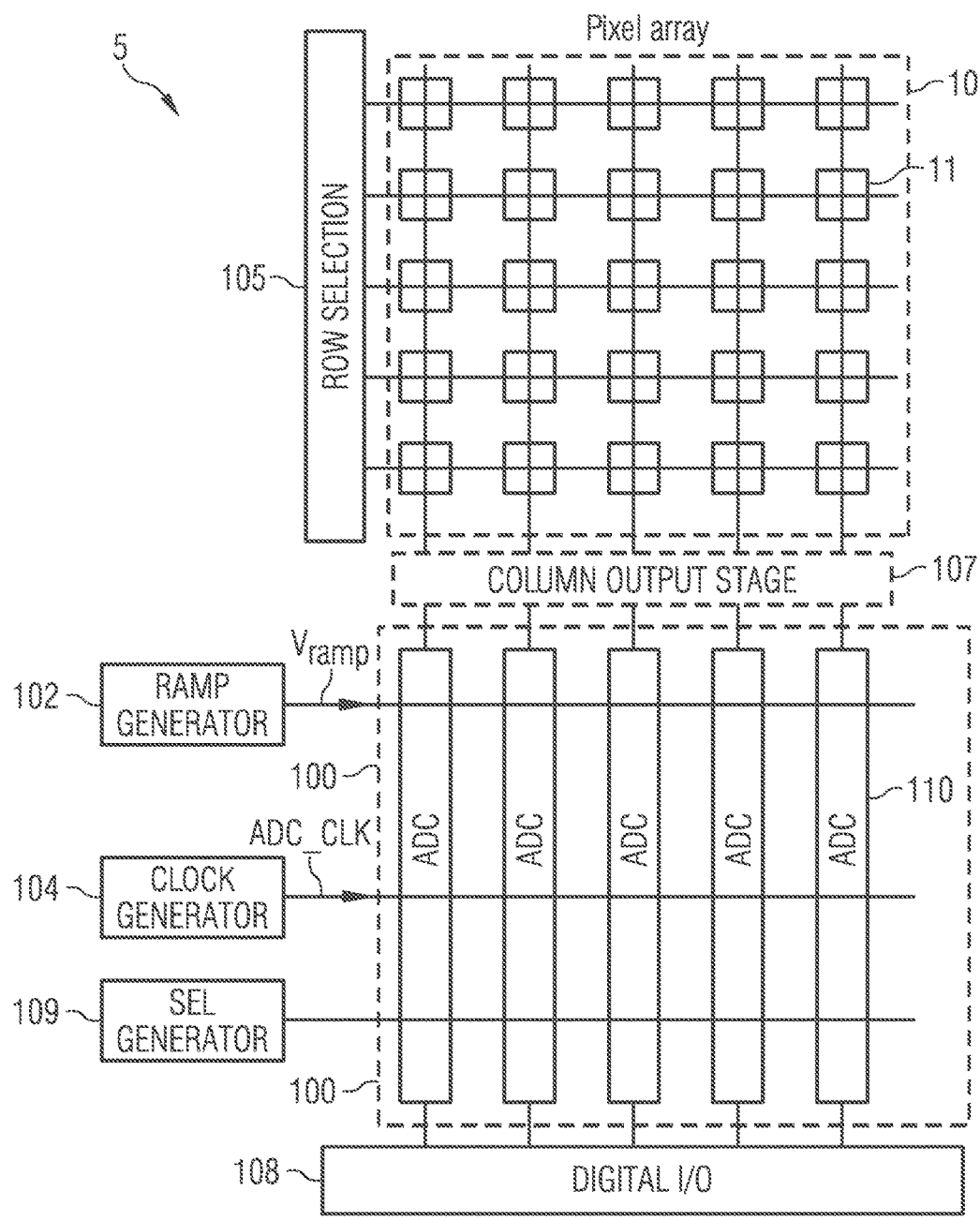
FIG. 5 shows an image sensor and column ADC units.

FIG. 5 shows an image sensor 5 with a ramp ADC. The image sensor 5 comprises a pixel array 10 comprising a plurality of pixels 11. The pixels 11 can be arranged in a rectangular array of rows and columns of pixels, as shown in FIG. 5. Alternatively, the pixels can be arranged in any other suitable pattern.

An analog-to-digital conversion apparatus 100 is provided for analog-to-digital conversion of outputs of the pixel array 10. An analog-to-digital converter 110, abbreviated ADC, is provided for each column of the pixel array 10. The set of ADCs 110 can be operated in parallel with one another, thereby increasing the speed at which data can be read from the pixel array 10 and converted to digital values. For ease of explanation, embodiments will be described in terms of a column of pixels sharing an ADC. As described above, an ADC 110 can be provided for any other group of pixels, such as a row of pixels or a diagonal group of pixels. Another possible configuration is the use of two or more ADCs per pixel column pitch. This allows to read out two rows of the pixel array in parallel. Another possibility is the use of one ADC per two or more columns.

While it is possible to read just one analog value from a pixel 11, it is more usual to read two analog signals from the pixel 11 using a technique called Correlated Double Sampling (CDS). The two analog signals are a reset voltage, Vres, and a signal voltage, Vsig. The reset voltage Vres is a voltage of the pixel 11 following the reset of the pixel 11 itself. This can also be described as a noise level of the pixel 11. The signal voltage Vsig is a voltage of the pixel 11 following exposure to light during an exposure period. This disclosure refers to signal voltages read from a pixel array 10. It is also possible to read signal currents from a pixel array 10. The term "analog signal" is intended to include voltages and currents.

Each of the ADCs 110 receives the two analog signals from a column of the pixel array 10. A useful quantity is the difference (Vsig-Vres) between the signal voltage Vsig and the reset voltage Vres. Each of the ADCs 110 can convert a difference between the two analog signals, Vres and Vsig, to a digital value. A row selection circuit 105 controls which row of pixels 11 of the pixel array 10 is read out. For example, rows can be selected one at a time, on a rotating basis. When a row is selected, a reset level and a signal level can be read from each pixel 11 of the selected row, and output on a column output bus. The values read from the pixel 11 can be stored in a column output stage 107, such as a sample-and-hold stage.

A ramp generator 102 generates a ramp signal Vramp which is distributed to the ADCs 110.

A clock generator 104 generates at least one clock signal ADC_CLK which is distributed to the ADCs 110. It is possible to use multiple clock signals which are offset in phase from one another. Each ADC 110 uses the ramp signal Vramp and the clock signal(s) ADC_CLK to perform analog-to-digital conversion.

It is possible, in any of the examples, to provide a clock generator 104 and/or a ramp generator 102 more locally to each ADC 110 in the manner described in U.S. Pat. No. 8,040,269. For example, there can be a clock generator 104 and/or a ramp generator 102 per analog-to-digital converter 110, or a clock generator 104 and/or a ramp generator 102 per sub-set of the overall set 100 of ADCs.

Figure 6:
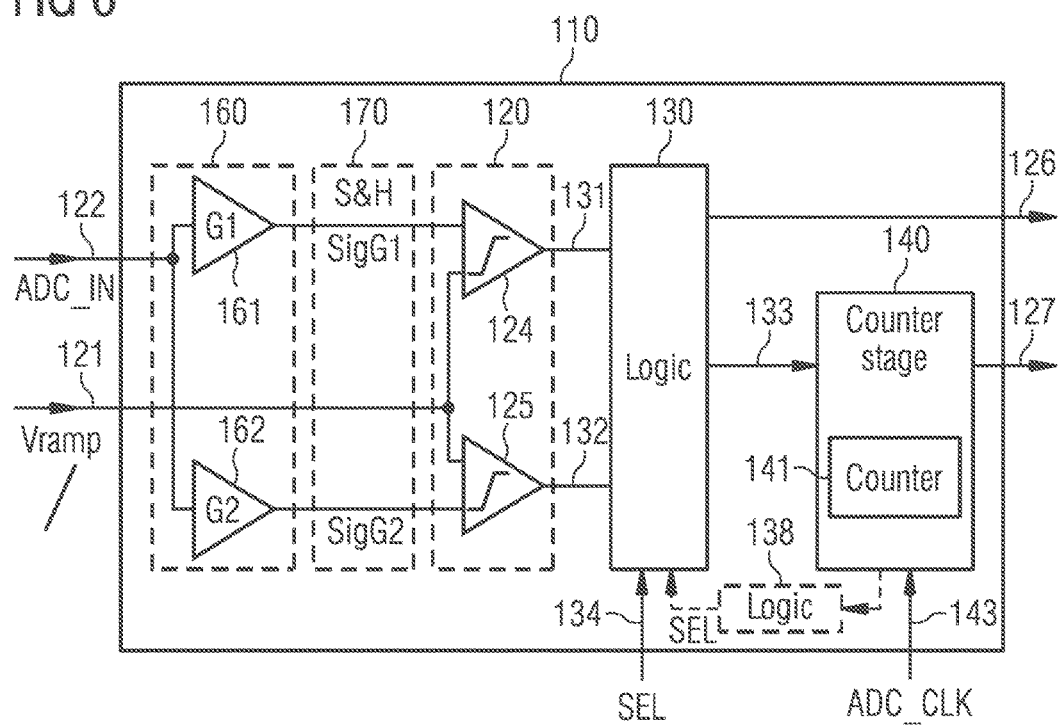
FIG. 6 shows an ADC unit for use in the image sensor of FIG. 5.

FIG. 6 shows an example of an analog-to-digital converter 110 which can be used to perform analog-to-digital conversion of signals on a column output of a pixel array 10. The ADC 110 comprises a ramp signal input 121 for receiving the ramp signal Vramp. The ADC 110 comprises an analog signal input 122 for receiving at least one analog signal ADC_IN from the pixel array 10. The ADC 110 may sequentially receive an analog signal, namely the signal voltage Vsig, and a further analog signal, namely the reset voltage Vres, on input 122.

The ADC 110 comprises an amplifying stage 160. In this example the amplifying stage 160 comprises two amplifiers 161, 162. The amplifying stage 160 is connected to the analog signal input 122. The amplifying stage 160 is configured to generate a set of N amplified analog signals, where N is an integer ≥2. The set of N amplified analog signals have different gains. For example, a first amplified analog signal SigG1 has a first gain G1 and a second amplified analog signal SigG2 has a second gain G2, where G1≠G2. The first gain G1 may be lower than the second gain G2. The gain signals are related by a signal gain ratio. To simplify the explanation, consider that the SigG2 signal has a gain which is eight times (8×) higher than the SigG1 signal. The SigG2 signal provides a quantisation step with a magnitude 8× lower (input referred) than the SigG1 signal.

The ADC 110 comprises a comparison stage 120. In this example the comparison stage comprises two comparators 124, 125. The comparison stage 120 has inputs 121 connected to the amplifying stage 160. The comparison stage 120 receives the set of N amplified analog signals from the amplifying stage 160.

Optionally, a sample and hold (S&H) stage 170 may be connected between the amplifying stage 160 and the comparison stage 120. The S&H stage 170 can store a set of amplified analog signals output by the amplifying stage 160.

The ADC 110 also comprises a logic unit 130 and a counter stage 140. The ramp signal input 121 is connected to a respective first input of each of the comparators 124, 125. A first of the amplified analog signals (SigG1) is connected to a second input of a first comparator 124 that also may be called low gain comparator. The first amplified analog signal may be named low gain signal. A second of the amplified analog signals (SigG2) is connected to a second input of a second comparator 125 that may be named high gain comparator. The second amplified analog signal SigG2 may be named high gain signal in the case N=2. The ADC can be extended to a larger number of amplified analog signals and comparators, as will be described later. An output of each of the comparators 124, 125 is connected to the logic unit 130. An output 133 of the logic unit 130 is connected to the counter stage 140. The clock signal ADC_CLK is applied to a clock input 143 of the counter stage 140. The counter stage 140 comprises at least one counter 141. For simplicity, a single counter example will be described.

In operation, the counter 141 is selectively enabled during a conversion period. The counter stage 140 is enabled by the signal received from the logic unit 130. The logic unit 130 determines which comparison output 131, 132 should control the counter stage 140. A counter value (i.e. a digital number) accumulated by the counter 141 during the period that the counter 141 is enabled as representative of the analog signal ADC_IN applied at input 122. An output 127 outputs a digital counter value. An output 126 indicates which comparison output 131, 132 was used to control the counter stage 140.

The maximum input voltage of the ADC 110 is referred to as VSAT (FIG. 8). A low-light limit is defined as the maximum signal which can be converted using the first amplified analog signal SigG1 signal. In this example the low-light limit is VSAT/8.

Referring again to FIG. 6, the logic unit 130 receives a signal SEL at input 134. SEL is a digital signal. A change in state of the SEL signal represents a point at which the ramp signal Vramp crosses the low-light limit. This will be called a handover point. The handover point is indicative of a point at which a different comparison output 131, 132 (e.g. a different one of the comparators 124, 125) can be used to control the counter stage 140.

The handover point is predetermined. A duration between a start of the conversion period and the handover point is predetermined. Said duration consists of a predetermined number of clock cycles. The ramp signal Vramp starts at the start of the conversion period.

The SEL signal performs a switching from one logic level to another logic level at the handover point. The switching may occur from "0" to "1" or from "1" to "0". In the example shown in FIG. 8, the SEL signal has a logic level "1" from t=0 until the handover point at t=32 clock cycles. The SEL signal can change state when a threshold number of clock cycles is reached after the start of a conversion period. In the example of FIG. 8, the SEL signal changes state (from logical "1" to "0") after 32 clock cycles (256/8) of the conversion period. The SEL signal can be supplied by a SEL generator unit 109 unit external to the ADC 110 which distributes the SEL signal to the plurality of ADCs 110 in a similar manner to the ramp signal Vramp and the clock signal ADC_CLK. The SEL signal is received at an input 134. An alternative way of providing the SEL signal is shown in FIG. 6 in dashed form. The SEL signal can be internally generated by the ADC 110. An output of the counter stage 140 is connected to a logic unit 138. The logic unit 138 compares the counter value with a threshold counter value (e.g. 32). The logic unit 138 outputs the SEL signal to the logic unit 130. The SEL signal toggles when the counter value reaches the threshold value of the handover point.

The function of the logic unit 130 is to decide, during a conversion period, which comparison output (131 or 132) controls the counter stage 140. The function of the logic unit 130 is:

for an analog signal in the range 0<analog signal ADC_IN<low-light limit, the second comparator 125 connected to the high gain signal SigG2, controls the counter stage 140;

for an analog signal in the range low-light limit<analog signal ADC_IN<VSAT, the first comparator 124 connected to the low gain signal SigG1, controls the counter stage 140. The handover point is a point in time at which a decision can be made to handover control of the counter stage 140 from one of the comparison outputs to a different comparison output. The decision of whether to handover control is based on the output of at least one of the comparators. The decision of whether to handover control may be based on the output of the first comparator 124 that receives the lowest gain amplified analog signal SigG1. The first comparator 124 may be called lowest gain comparator or, in case N=2, low gain comparator.

FIG. 8 shows two examples of pixel signals to be converted: a dark pixel signal (Sig1) and a bright pixel signal (Sig2).

Firstly, consider that a low-light signal Sig1 is applied to both amplifiers 161, 162. The amplified output of a first amplifier 161 is Sig1G1. As G1=1, the output of the first amplifier 161 is simply Sig1. The amplified output of a second amplifier 162 is Sig1G2. As G2=8, the output of the second amplifier 162 is eight times (8×) Sig1G1. The low gain comparator 124 toggles at time TogS1G1, when the ramp signal Vramp crosses the low gain signal Sig1G1. Toggling means that a comparator changes the logical value of an output signal of the comparator. As this toggling has occurred before the handover point, the logic determines that the analog signal ADC_IN is below the low-light limit and that the high gain signal Sig1G2 falls within the range VSAT. Therefore, the logic determines that the comparison of the high gain signal Sig1G2 with the ramp signal Vramp should be used to control the counter stage 140. The comparison output 132 of the second comparator 125 toggles at time TogS1G2, when the ramp signal Vramp crosses the high gain signal Sig1G2. This stops the counter stage 140. This provides a finer quantisation of the AD conversion than is possible with the low gain signal Sig1G1. Since the high gain signal Sig1G2 is 8× amplified, its quantisation error is reduced by 8× as well. Therefore, the 8-bit ADC provides the equivalent quantisation step of an 11-bit ADC.

Secondly, consider that the bright-pixel signal Sig2 is applied to both amplifiers 161, 162. The amplified output of the first amplifier 161 is the low gain signal Sig2G1. As G1=1, the output is simply Sig1. The amplified output of the second amplifier 162 is the high gain signal Sig2G2. The low gain comparator 124 does not toggle before the handover point at t=32 clock cycles. The logic determines that the analog signal ADC_IN is above the low-light limit and that only the low gain signal Sig2G1 falls within the range VSAT ADC (i.e. the high gain signal Sig2G2 exceeds VSAT ADC). Therefore, the logic determines that the comparison of the low gain signal Sig2G1 with the ramp signal Vramp should be used to control the counter stage 140. The low gain comparison output 131 of the first comparator 124 toggles at time TogS2G1, when the ramp signal Vramp crosses the low gain signal Sig2G1. This stops the counter stage 140. The bright-pixel signal Sig2 has been converted after ×1 amplification by an 8-bit converter, with the quantisation noise of an 8-bit converter. This is acceptable because Sig2 is a high-light signal with photon shot noise higher than the quantisation noise of the 8-bit ADC.

The ADC 110 comprises a control stage which can be implemented as the logic unit 130. The control stage may comprise the logic unit 130 and the logic unit 138. The logic unit 130 e.g. may make a decision, at the handover point, whether to handover control of the counter stage 140 from the low gain comparator 124 to the high gain comparator 125.

The logic unit 130 uses a comparison output 132 of the highest gain amplified analog signal (that may be named high gain signal SigG2 in case N=2) to control the counter stage 140 from a start of the conversion period up to a first handover point. In case N=2, only one handover point is used.

The logic unit 130 may make a decision, at the handover point, whether to handover control of the counter stage 140 from the high gain comparator 125 to the low gain comparator 124.

The low gain comparator 124 is conditionally connected to the counter stage 140, and remains connected until the end of the conversion period, if both of the following conditions apply:

(i) the ramp signal Vramp has reached the low-light limit (i.e. the handover point has been reached);

(ii) the low gain comparator 124 has not toggled before the ramp signal Vramp reaches the low-light limit.

If the low gain comparator 124 has toggled before it reaches the low-light limit, it means that the signal falls within the amplitude range:

$$0 < \text{analog signal ADC\_IN} < \text{low-light limit}$$

and therefore the high gain comparator 125 can be used without saturating the ADC 110.

Figure 7:
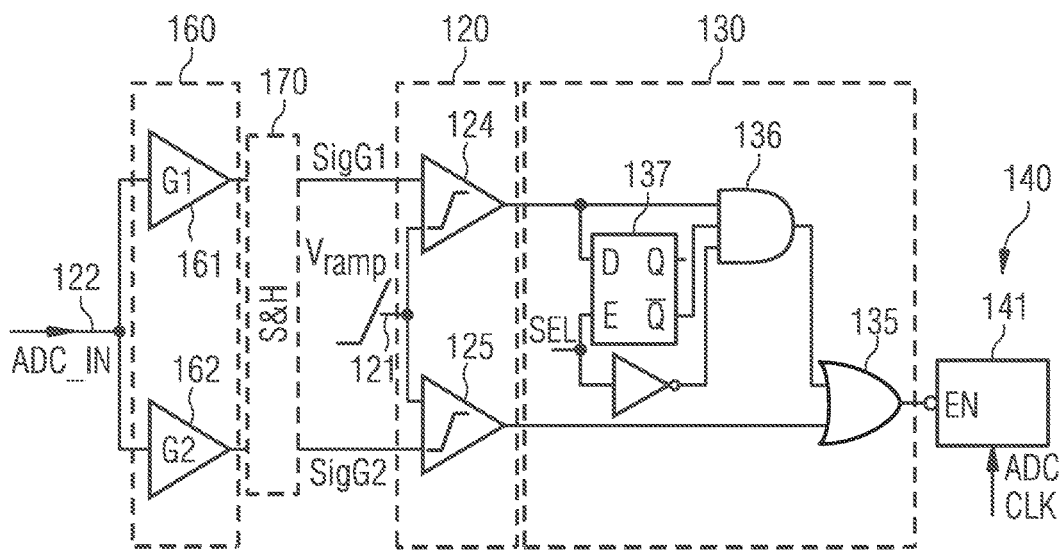
FIG. 7 shows an example logic unit for use in the ADC unit of FIG. 6.

FIG. 7 shows an example of the logic unit 130 to implement the functionality described above. The logic unit 130 comprises an OR gate 135, an AND gate 136 and a storage element (e.g. a gated latch) 137.

At the end of the conversion period, the counter stage 140 stores an accumulated counter value which is representative of either:

(i) a number of clock cycles before the low gain comparator 124 disabled the counter stage 140; or (ii) a number of clock cycles before the high gain comparator 125 disabled the counter stage 140.

Therefore, the counter value may require scaling to an appropriate final value depending which comparator controlled the counter stage 140. In the illustrated example the high gain signal SigG2 is eight times (8×) larger than the low gain signal SigG1. Therefore, a counter value accumulated when the low gain comparator 124 controlled the counter stage 140 requires scaling (multiplication) by the gain signal ratio. In this example the gain signal ratio is 8. In the digital domain, multiplication by a factor of 8 is readily achieved by left-shifting a binary value by 3 slots in a register. The memory element 137 provides an output (Q)=logical "1" if the high gain comparator 125 output was used to control the counter stage 140. This allows the ADC to know whether the counter stage 140 has been stopped by the low gain comparator 124 or by the high gain comparator 125. An output 126 of the logic unit 130 indicates which comparator (124 or 125) was used to control the counter stage 140. The output 126 can be stored as an additional bit alongside the count value. Alternatively, the output 126 can be used to modify the count value.

It will be understood that the logic unit 130 can be implemented in other ways to achieve similar functionality. For example, different kinds of latches and/or gates can be used. In other logic unit implementations, it will be understood that a logical "0" may indicate that the high gain comparator 125 was used to control the counter, rather than the logical "1" described above.

The ADC 110 described above can be used to convert a single analog signal ADC_IN. Correlated Double Sampling (CDS) is a technique which determines the reset level Vres of the pixel 11 and the signal level Vsig of the pixel 11. The reset level Vres is subtracted from the signal level Vsig to cancel the reset noise and reduce the fixed pattern noise of the pixel. Therefore, it is desirable for the ADC 110 to determine a difference between two analog signals Vres and Vsig.

FIGS. 9A and 9B show examples of an ADC 110 for a correlated double sampling signal applied at its input. FIGS. 9A and 9B show the ADCs and FIG. 10 shows operation of the ADC.

The reset level Vres and the signal level Vsig read from a pixel 11 can be stored in a sample & hold (S&H) stage 170. The reset level Vres can be realized as reset voltage. The signal level Vsig can have the form of a signal voltage. The S&H stage 170 can form part of a column output stage 107 of the column, as shown in FIG. 9A. In this option, sample & hold (S&H) capacitors Cr, Cs are provided. Capacitor Cs stores the exposure signal Vsig and capacitor Cr stores the reset signal Vres. Capacitor Cs is connected to the analog signal input 122 during a Vsig conversion period. Capacitor Cr is connected to the analog signal input 122 during a Vres conversion period.

FIG. 9B shows an alternative configuration. The S&H stage 170 is located between the amplifying stage 160 and the comparison stage 120. Each amplifier output is selectively connectable to a pair of capacitors Cs, Cr. Capacitor Cs stores an amplified exposure signal and capacitor Cr stores an amplified reset signal. Capacitor Cs is connected to a respective input of the comparison stage 120 during a Vsig conversion period. Capacitor Cr is connected to a respective input of the comparison stage 120 during a Vres conversion period. This configuration can reduce thermal noise of the S&H stage.

A storage stage 150, such as static random-access memory (SRAM), is connected to the counter stage 140 and to the logic unit 130. The counter stage 140 outputs an accumulated counter value to the storage stage 150. The logic unit 130 outputs an indication of which comparator was used during the conversion to the storage stage 150. Digital values can be read from the storage stage 150.

Referring to FIG. 10, there is a Vsig conversion period 201 and a Vres conversion period 202. During the Vsig conversion period 201 the Vsig analog signal is converted to a digital counter value. During the Vres conversion period 202 the Vres analog signal is converted to a digital counter value. In this example, the Vsig conversion period 201 occurs before the Vres conversion period 202.

There are several possible methods of operation.

In a first method, the ADC 110 selects which gain signal comparator controls the counter during the Vsig conversion period 201 and the same gain signal comparator (high gain or low gain) is used to control the counter during the Vres conversion period 202. Using the same gain signal comparator and hence gain amplifier has an advantage of reducing or avoiding problems due to gain variation among different amplifiers.

In a second method, the ADC 110 selects which gain signal comparator controls the counter the Vsig conversion period 201 and the high gain signal comparator 125 controls the counter during the Vres conversion period 202. This has an advantage of lower quantisation and thermal noise during the Vres conversion period 202.

In a case where different gain signal comparators are used to control the counter during the Vsig conversion period 201 and the Vres conversion period 202, a gain signal conversion factor is applied to the counter value obtained using the high gain comparator 125 before combining with the counter value obtained using the low gain comparator 124.

In another example, the Vres conversion period 202 occurs before the Vsig conversion period 201. A disadvantage of this order is that the gain selected for conversion of Vres may be different to the gain needed to convert Vsig. This requires gain ratio calibration before a digital subtraction (Vsig−Vres) can be performed at the column.

Returning to FIGS. 9A and 9B, there are several possible ways in which the ADC 110 can be operated.

In a first method, an accumulated counter value is stored in the storage stage 150. A gain signal indicator is received at the storage stage 150. The gain signal indicator can be a 1 bit value in the case of two gain signals. If the gain signal indicator indicates that the low gain comparator 124 was used for the conversion, the counter value is shifted (multiplied) by the amplifier gain ratio conversion factor. In the example described above, the counter value is an 8 bit number. The gain signal ratio conversion factor is 8 (=3 bit number). The accumulated counter value is left-shifted by 3 bits to form an 11 bit number.

In a second method, an accumulated counter value is stored in the storage stage 150. A gain signal indicator is received, and stored, at storage 150. The non-shifted counter value (8 bits) and the gain signal indicator (1 bit) are read from the storage stage 150.

FIG. 10 shows two worked examples for a high light signal Sig1' and a low light signal Sig2'. In these examples the same gain comparator is used to control the counter during conversion periods 201 and 202. For the high light signal Sig1', the low gain comparator 124 (Sig1G1) is selected to control the counter during the Vsig conversion period 201 because Sig1' is above the low-light limit. A count value=10 is accumulated. The same low gain comparator 124 is used to control the counter during the Vres conversion period 202. A count value=1 is accumulated. The difference (count signal−count reset)=10−1=9. For the low light signal Sig2', the high gain comparator 125 (Sig2'G2) is selected to control the counter during the Vsig conversion period 201 because Sig2' is below the low-light limit. A count value=19 is accumulated. The same high gain comparator 125 is used to control the counter during the Vres conversion period 202. A count value=1 is accumulated. The difference (count signal−count reset)=19−1=18. A scaling factor can be applied to the number converted using the low gain comparator 124. In this example, a scaling factor of 8 gives a final value:

$$Sig1'=9\times 8=72.$$

An advantage of at least one example is that the low-light limit can be easily increased or decreased by modifying the SEL signal. If the gain signal ratio is not well defined (e.g. not calibrated) a digital code discontinuity could be observed at signal levels close to the low-light limit, generating fixed pattern noise (FPN). It is possible to shift the low-light limit (up or down) in a random fashion on a frame-by-frame basis, row-by-row basis, column-by-column basis, or any other desired basis to randomise the error. For some applications, this randomisation of the FPN can be sufficient, thereby avoiding the need to calibrate the gain signal ratio. This reduces the complexity of the system.

The examples described above use a counter stage 140 with a single counter 141. In other examples, it is possible to use a counter stage 140 with a plurality of counters. An ADC with a set of counters is described in EP 2 757 776 A2. The principles described in that document can be used in conjunction with multiple ramp conversion described in this disclosure.

FIG. 11 shows an ADC 110 with a counter stage 140 having a plurality of counters 141, 142. This example has two counters: the counter 141 and a further counter 142. The counter 141 is operable to count in an upwards direction and the further counter 142 is operable to count in a downwards direction. In use, one of the counters (the counter 141, the further counter 142) is enabled at a time. When the counter 141 is enabled, the further counter 142 is disabled. Similarly, when the further counter 142 is enabled, the counter 141 is disabled.

A clock signal, ADC_CLK, is applied to the counter stage 140. The two counters can be configured to operate at opposite clock phases from each other. The counter 141 operates on a rising edge of the clock signal ADC_CLK and the further counter 142 operates on a falling edge of the clock signal ADC_CLK. Providing one counter which operates on the rising edge of the clock signal ADC_CLK and another counter which operates on the falling edge of the clock signal ADC_CLK is functionally equivalent to, and can be implemented by, having two clock signals which are offset in phase by 180 degrees. The falling edge operation of the further counter 142 can be implemented by inverting the clock signal, ADC_CLK, at the input to the further counter 142, to create a second, inverted, version of the clock signal, ADC_CLK. Counter 142 can then operate on the rising edge of the inverted version of the clock signal.

Each of the counters 141, 142 accumulates a count of rising edges (falling edges) during a period in which it is enabled and outputs a digital value equal to this count. Outputs of the counters 141, 142 are applied to an output stage. In this embodiment, the output stage comprises an adder 151. An output of the adder 151 can be selectively output to the storage stage 150. Data can be selectively output from the storage stage 150 to a data bus.

FIG. 12 shows operation of the ADC 110 of FIG. 11 for two signals: a high light signal Sig1' and a low light signal Sig2'. In these examples the same gain signal comparator is used to control the counter during conversion periods 201 and 202. For the high light signal Sig1', the low gain comparator 124 (signal Sig1'G1) is selected to control the counter during the Vsig conversion period 201 because Sig1' is above the low-light limit. During the Vsig conversion period 201 the counter 141 is enabled up to the point where the ramp signal Vramp crosses the analog signal Sig1'G1. Then, the counter 141 is disabled and the further counter 142 is enabled. At the end of the Vsig conversion period the further counter 142 is disabled. During the Vres conversion period 201, the further counter 142 is initially enabled up to the point where the ramp signal Vramp crosses the analog reset signal Vres. Then, the further counter 142 is disabled and the counter 141 is enabled. At the end of the Vres conversion period the counter 141 is disabled. The conversion of the low light signal Sig2' is similar. The accumulated counter value of the counter 141 is:

$V$sig−$V$res+$x$.

The accumulated counter value of the further counter 142 is:

$V$sig−$V$res−$y$.

where:
$x$ is the number of clock cycles in the Vres conversion period 202 and
$y$ is the number of clock cycles in the Vsig conversion period 201.

The values $x$ and $y$ can be subtracted from the final result by starting the counter at an offset value. For example, by starting the counter 141 at −$x$, the final counter value is Vsig−Vres. If a handover point is internally generated using the counter, then an appropriate adjustment can be made to the handover point.

The use of two counters provides a substantially constant current consumption during the conversion cycle, regardless of the analog signal values, because one of the counters is always operating. If the counters use clock signals with offset phases, additional conversion accuracy is possible.

The number of counters can be increased beyond two. More generally, there can be a set of C counters divided into a sub-set of M counters and a sub-set of K counters, where C=M+K.

The examples described above use two gain signals. A gain signal can be called amplified analog signal. It is possible to extend the number of gain signals to N, where N is an integer ≥2.

FIG. 13 shows an ADC 110 with N gain signals. In this example the comparison stage 120 has N comparators 124, 125, 125'. Each comparator has an input connected to one of the gain signals and an input connected to the ramp signal Vramp. The logic unit 130 is modified from the logic shown in FIG. 7. Multiple thresholds define the handover points between the different comparators. In general, for N gain signals, N−1 thresholds (handover points) are required. Thus, the number of handover points is N−1. Each threshold can be defined as a number of clock cycles from a start of a conversion period. Said number or said numbers of clock cycles are predetermined.

A three gain signal example can have gains such as a first gain G1, a second gain G2, and a third gain G3 with gain values G1=1, G2=4, G3=8 and gain ratios: G2/G1=4 and G3/G2=2. Suitable threshold numbers of clock cycles (assuming a total number of clock cycles=256) are: SEL1=32 and SEL2=64.

FIG. 14 shows operation of the ADC 110 with three gain signals (N=3). The three gain signals SigG1, SigG2, SigG3 have the ratios defined above. There are (N−1)=2 limits and two thresholds/handover points. Due to the different gains of the N amplifiers 161-163, the N comparators 124, 125, 125' can be used to control the counter over different ranges of input signals ADC_IN. The lowest gain amplifier 161 and associated comparator is the first comparator 124. This can control the counter when the input signal ADC_IN is in the range: VSAT/4<ADC_IN<VSAT. The input signal ADC_IN can also be called analog signal. The medium gain amplifier 162 and associated comparator is the second comparator 125. This can control the counter when the input signal ADC_IN is in the range: VSAT/8<ADC_IN<VSAT/4. The highest gain amplifier 163 and associated comparator is a third comparator 125'. This can control the counter when the input signal ADC_IN is in the range: 0<ADC_IN<VSAT/8.

From t=0 until the first handover point 1, only the third comparator 125' that is the Nth comparator is connected to the counter. Thus, the comparison output of the highest gain amplified analog signal SigG3 controls the counter stage 140 from the start of the conversion period up to a first handover point.

At the first handover point 1, the first comparator 124 (lowest gain signal) is checked. If the first comparator 1 has toggled before the first handover point 1, it indicates that the analog signal ADC_IN is in the range:

0<ADC_IN<Limit 1($V$SAT/8).

Therefore, the third comparator 125' (highest gain signal) is best suited to control the counter stage 140, and remains connected to the counter stage 140. Since the lowest gain comparison output has changed state before the first handover point, the counter stage 140 is continuously controlled by the same comparison output after the first handover point, namely by the comparison output of the highest gain amplified analog signal SigG3. The first and the second comparators 124 and 125 remain disconnected from the counter stage 140.

If the first comparator 124 has not toggled before the first handover point 1, it indicates that the analog signal ADC_IN is in the range:

Limit 1($V$SAT/8)<ADC_IN<$V$SAT.

The second comparator 125 (medium gain) is best suited to control the counter stage 140, and is connected to the counter stage 140. Since the lowest gain comparison output has not changed state before the first handover point, the counter stage 140 is controlled by the comparison output of the lower gain amplified analog signal after the first handover point. The lower gain amplified analog signal is the (N−1)th amplified analog signal. The lower gain amplified analog signal is the medium gain signal in case N=3 (and the low gain signal in case N=2).

At a second handover point 2, the first comparator 124 (lowest gain signal) is checked again. If the first comparator 124 has toggled before the second handover point 2 and not before the first handover 1, it indicates that the analog signal ADC_IN is in the range:

Limit 1($V$SAT/8)<ADC_IN<Limit 2($V$SAT/4).

The second comparator 125 (medium gain) is best suited to control the counter stage 140, and is connected to the counter stage 140, or remains connected to the counter stage 140. If the first comparator 124 has not toggled before the second handover point 2, it indicates that the analog signal ADC_IN is in the range:

Limit 2($V$SAT/4)<ADC_IN<$V$SAT.

Therefore, the first comparator 124 (lowest gain) is best suited to control the counter stage 140, and is connected to the counter stage 140.

A four gain signal example can have gains the first gain G1, the second gain G2, the third gain G3, and a fourth gain G4 with the gain ratios: G2/G1=2, G3/G2=2, G4/G3=2. Suitable threshold numbers of clock cycles (assuming a total number of clock cycles=256) are: SEL1=32, SEL2=64 and SEL3=128. These ratios can be adapted to the application or desired performance.

The comparison stage 120 can have N comparators, or N comparison outputs. Each output provides a comparison of one of the N amplified analog signals with the ramp signal Vramp.

For the N>2 case (e.g. N=3, N=4 . . . ), it can be possible to provide a comparison stage 120 with a smaller number of comparison outputs. For example, the comparison stage 120 can have a smaller number of comparators. A minimum of two comparison outputs/comparators can be used. One of the comparators can be connected to the lowest gain amplified analog signal. The other comparator can be selectively connected to one of the amplified analog signals, depending on which amplified analog signal should control the counter stage at that point during the conversion period.

In any of the examples described above, at least one of the gain values used in the gain signal ratio can be a non-integer value.

In any of the examples described above, one of the gain values used in the gain signal ratio can be unity (1).

Each threshold can be signaled to the logic by a respective signal SEL, similar to the signal SEL shown in FIG. 8, which toggles state when the threshold number of clock cycles is reached. It is also possible to input one multi-bit digital signal SEL which represents which threshold has been crossed, instead of a bundle of individual 1-bit SEL lines. If this option is used, additional logic is required to encode and decode the multi-bit SEL signal.

An advantage of the method described here is that it only requires a single ADC.

An advantage of the method is that it allows faster conversion as there is no requirement to perform a comparison before the A-to-D conversion to determine the best gain signal. The method is free of a phase or period for determination the gain that is used in the conversion period.

An advantage of the method is that the digital signal SEL can be changed after each conversion, such as in a random fashion. This can randomise the fixed pattern noise of the ADC at the switching point between gain signals. If not randomised or calibrated, the fixed pattern noise of the ADC can be visible to the human eye even when its value is lower than that of the temporal noise.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of embodiments is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the invention.

The invention claimed is:

1. An analog-to-digital converter for an imaging device comprising:
    an analog signal input for receiving an analog signal from a pixel array of the imaging device;
    an amplifying stage configured to generate a set of N amplified analog signals, where N is an integer ≥2, the set of N signals having different gains;
    a ramp signal input for receiving a ramp signal;
    a clock input for receiving at least one clock signal;
    a comparison stage connected to the amplified analog signals and to the ramp signal input, the comparison stage comprising a minimum of two comparators and being configured to compare the amplified analog signals with the ramp signal during a conversion period to provide comparison outputs;
    a counter stage; and
    a control stage which is configured to:
        control the counter stage based on the comparison outputs and a selection input indicative of when at least one handover point has been reached during the conversion period, wherein the handover point is indicative of a point at which a comparison of a different one of the amplified analog signals with the ramp signal is operable to control the counter stage, and
        wherein the control stage is configured to use a comparison output of a highest gain amplified analog signal to control the counter stage from a start of the conversion period up to a first handover point.

2. The analog-to-digital converter according to claim 1, wherein the control stage is configured to:
    determine, during the conversion period, if a lowest gain comparison output of a lowest gain amplified analog signal has changed state before a first handover point; and if the lowest gain comparison output has not changed state before the first handover point, to use a comparison output of a lower gain amplified analog signal to control the counter stage after the first handover point.

3. The analog-to-digital converter according to claim 1, wherein the control stage is configured to:
   determine, during the conversion period, if a lowest gain comparison output of a lowest gain amplified analog signal has changed state before the first handover point; and
   if the lowest gain comparison output has changed state before the first handover point, to continue to control the counter stage using the same comparison output after the first handover point.

4. The analog-to-digital converter according to claim 1, further comprising an output stage which is configured to output a counter value which has been scaled based on a comparison output of which amplified analog signal controlled the counter stage during the conversion period.

5. The analog-to-digital converter according to claim 1, further comprising an output stage which is configured to output a counter value and an indication of a comparison output of which amplified analog signal controlled the counter stage during the conversion period.

6. The analog-to-digital converter according to claim 1, wherein the converter is configured to determine when the handover point has been reached during the conversion period using an output of the counter stage.

7. The analog-to-digital converter according to claim 1, further comprising an analog signal storage stage connected between the amplifying stage and the comparison stage, the analog signal storage stage configured to store a set of amplified analog signals.

8. The analog-to-digital converter according to claim 1, wherein the comparison stage comprises N comparators, each comparator having a first comparator input connected to one of the N amplified signal outputs, a second input connected to a ramp signal input and a comparison output.

9. An image sensor comprising:
   a pixel array; and
   an analog-to-digital conversion apparatus comprising:
      a plurality of analog-to-digital converters;
      a ramp signal generator configured to generate a ramp signal; and
      a clock signal generator configured to generate at least one clock signal;
      wherein an analog-to-digital converter of the plurality of analog-to-digital converters comprises:
         an analog signal input for receiving an analog signal;
         an amplifying stage configured to generate a set of N amplified analog signals, where N is an integer ≥2, the set of N signals having different gains;
         a ramp signal input for receiving the ramp signal;
         a clock input for receiving the at least one clock signal;
         a comparison stage connected to the amplified analog signals and to the ramp signal input, the comparison stage comprising a minimum of two comparators and being configured to compare the amplified analog signals with the ramp signal during a conversion period to provide comparison outputs;
         a counter stage; and
         a control stage which is configured to control the counter stage,
         wherein the converter is configured to:
            convert a first analog signal during a first conversion period,
            convert a second analog signal during a second conversion period, wherein one of the analog signals represents a signal level following exposure of a pixel of the pixel array and the other of the analog signals represents a reset level of the pixel of the pixel,
            select a comparison output of one of the amplified analog signals to control the counter stage during the first conversion period, and
            select a comparison output of a different one of the amplified analog signals to control the counter stage during the second conversion period.

10. The image sensor according to claim 9, wherein the converter is configured to:
    select a comparison output of one of the amplified analog signals to control the counter stage during the first conversion period; and subsequently,
    use the same comparison output to control the counter stage during the second conversion period.

11. The image sensor according to claim 9, wherein the converter is configured to:
    convert the first analog signal representing the signal level following exposure of the pixel during the first conversion period; and subsequently,
    convert the second analog signal representing the reset level of the pixel during the second conversion period.

12. A method of analog-to-digital conversion for an imaging device comprising:
    receiving an analog signal from a pixel array of the imaging device;
    receiving a ramp signal;
    receiving at least one clock signal;
    generating a set of N amplified analog signals, where N is an integer ≥2, the set of N amplified analog signals having different gains;
    comparing the amplified analog signals with the ramp signal during a conversion period by a comparator stage comprising a minimum of two comparators;
    controlling a counter stage based on the comparison outputs and a selection input indicative of when at least one handover point has been reached during the conversion period, wherein the handover point is indicative of a point at which a comparison of a different one of the amplified analog signals with the ramp signal is operable to control the counter stage;
    using a comparison output of a highest gain amplified analog signal to control the counter stage from a start of the conversion period up to a first handover point.

13. An analog-to-digital converter for an imaging device comprising:
    an analog signal input for receiving an analog signal from a pixel array of the imaging device;
    an amplifying stage configured to generate a set of N amplified analog signals, where N is an integer ≥2, the set of N signals having different gains;
    a ramp signal input for receiving a ramp signal;
    a clock input for receiving at least one clock signal;
    a comparison stage connected to the amplified analog signals and to the ramp signal input, the comparison stage comprising a minimum of two comparators and being configured to compare the amplified analog signals with the ramp signal during a conversion period to provide comparison outputs;

a counter stage; and a control stage which is configured to:

control the counter stage based on the comparison outputs and a selection input indicative of when at least one handover point has been reached during the conversion period, wherein the handover point is indicative of a point at which a comparison of a different one of the amplified analog signals with the ramp signal is operable to control the counter stage, determine, during the conversion period, if a lowest gain comparison output of a lowest gain amplified analog signal has changed state before a first handover point, and if the lowest gain comparison output has not changed state before the first handover point, to use a comparison output of a lower gain amplified analog signal to control the counter stage after the first handover point.

14. A method of analog-to-digital conversion for an imaging device comprising:

receiving an analog signal from a pixel array of the imaging device;

receiving a ramp signal;

receiving at least one clock signal;

generating a set of N amplified analog signals, where N is an integer $\geq 2$, the set of N amplified analog signals having different gains;

comparing the amplified analog signals with the ramp signal during a conversion period by a comparator stage comprising a minimum of two comparators;

controlling a counter stage based on the comparison outputs and a selection input indicative of when at least one handover point has been reached during the conversion period, wherein the handover point is indicative of a point at which a comparison of a different one of the amplified analog signals with the ramp signal is operable to control the counter stage;

determining, during the conversion period, if a lowest gain comparison output of a lowest gain amplified analog signal has changed state before a first handover point; and if the lowest gain comparison output has not changed state before the first handover point, using a comparison output of a lower gain amplified analog signal to control the counter stage after the first handover point.

* * * * *

UNITED STATES PATENT AND TRADEMARK OFFICE
CERTIFICATE OF CORRECTION

PATENT NO. : 10,348,323 B2
APPLICATION NO. : 15/773537
DATED : July 9, 2019
INVENTOR(S) : Adi Xhakoni, Tim Blanchaert and Guy Meynants It is certified that error appears in the above-identified patent and that said Letters Patent is hereby corrected as shown below:

In the Claims

Claim 9, Column 20:
Lines 5-6, delete "of the pixel of the pixel," and insert -- of the pixel, --.

Signed and Sealed this
Tenth Day of September, 2019

Andrei Iancu
*Director of the United States Patent and Trademark Office*